(12) United States Patent
Bedarida et al.

(10) Patent No.: US 7,522,455 B2
(45) Date of Patent: Apr. 21, 2009

(54) METHOD AND SYSTEM FOR REDUCING SOFT-WRITING IN A MULTI-LEVEL FLASH MEMORY

(75) Inventors: Lorenzo Bedarida, Milan (IT); Fabio Tassan Caser, Milan (IT); Simone Bartoli, Cambiago (IT); Giorgio Oddone, Genoa (IT)

(73) Assignee: Atmel Corporation, San Jose, CA (US)

( * ) Notice: Subject to any disclaimer, the term of this patent is extended or adjusted under 35 U.S.C. 154(b) by 147 days.

(21) Appl. No.: 11/144,174

(22) Filed: Jun. 2, 2005

(65) Prior Publication Data

US 2006/0140010 A1 Jun. 29, 2006

(30) Foreign Application Priority Data

Dec. 29, 2004 (IT) ............ MI2004A2538

(51) Int. Cl.
G11C 11/34 (2006.01)
(52) U.S. Cl. .................. 365/185.28; 365/185.03; 365/185.19; 365/185.2; 365/185.29
(58) Field of Classification Search .......... 365/185.03, 365/185.19, 185.2, 185.28, 185.14, 185.29
See application file for complete search history.

(56) References Cited

U.S. PATENT DOCUMENTS

| | | | |
|---|---|---|---|
| 4,653,023 A | 3/1987 | Suzuki et al. |
| 5,043,940 A | 8/1991 | Harari |
| 5,142,496 A | 8/1992 | Van Buskirk |
| 5,153,880 A | 10/1992 | Owen et al. |
| 5,218,570 A | 6/1993 | Pascucci et al. |
| 5,293,560 A | 3/1994 | Harari |
| 5,321,655 A | 6/1994 | Iwahashi et al. |
| 5,321,699 A | 6/1994 | Endoh et al. |
| 5,339,272 A | 8/1994 | Tedrow et al. |
| 5,386,388 A | 1/1995 | Atwood et al. |
| 5,394,362 A | 2/1995 | Banks |

(Continued)

FOREIGN PATENT DOCUMENTS

TW 0533428 5/2003

OTHER PUBLICATIONS

"Taiwan Application Serial No. 094145794 Office Action Mailed on Aug. 17, 2008".

*Primary Examiner*—Amir Zarabian
*Assistant Examiner*—Anthan T Tran
(74) *Attorney, Agent, or Firm*—Schwegman, Lundberg & Woessner, P.A.

(57) ABSTRACT

A system and method for reducing soft-writing in a multilevel flash memory during read or verify includes a memory cell. A first and second reference cells are coupled to the memory cell and are configured to receive a first and a second voltage. A current comparison circuit is coupled to the first and second reference cells and to the memory cell and is configured to compare current flow through the memory cell with current flow through the first and second reference cells, and to determine whether the memory cell holds a first range of values while the first reference cell receives the first voltage, and if the memory cell does not hold the first range of values, to determine whether the memory cell holds a second range of values while the second reference cell receives the second voltage, thereby reducing soft-writing during the read operation.

24 Claims, 8 Drawing Sheets

U.S. PATENT DOCUMENTS

| | | |
|---|---|---|
| 5,420,822 A | 5/1995 | Kato et al. |
| 5,434,825 A | 7/1995 | Harari |
| 5,469,444 A | 11/1995 | Endoh et al. |
| 5,495,442 A | 2/1996 | Cernea et al. |
| 5,523,972 A | 6/1996 | Rashid et al. |
| 5,539,690 A | 7/1996 | Talreja et al. |
| 5,555,204 A | 9/1996 | Endoh et al. |
| 5,566,125 A | 10/1996 | Fazio et al. |
| 5,570,315 A | 10/1996 | Tanaka et al. |
| 5,583,812 A | 12/1996 | Harari |
| 5,602,789 A | 2/1997 | Endoh et al. |
| 5,608,669 A | 3/1997 | Mi et al. |
| 5,608,676 A | 3/1997 | Medlock et al. |
| 5,621,686 A | 4/1997 | Alexis |
| 5,627,784 A | 5/1997 | Roohparvar |
| 5,638,320 A | 6/1997 | Wong et al. |
| 5,638,326 A | 6/1997 | Hollmer et al. |
| 5,642,312 A | 6/1997 | Harari |
| 5,648,934 A | 7/1997 | O'Toole |
| 5,654,918 A | 8/1997 | Hammick |
| 5,673,224 A | 9/1997 | Chevallier et al. |
| 5,684,739 A | 11/1997 | Takeuchi |
| 5,687,114 A | 11/1997 | Khan .................... 365/185.03 |
| 5,694,366 A | 12/1997 | Chevallier et al. |
| 5,729,489 A | 3/1998 | Fazio et al. |
| 5,729,490 A | 3/1998 | Calligaro et al. ....... 365/185.03 |
| 5,737,260 A | 4/1998 | Takata et al. |
| 5,748,546 A | 5/1998 | Bauer et al. ................. 365/210 |
| 5,764,568 A | 6/1998 | Chevallier |
| 5,764,571 A | 6/1998 | Banks |
| 5,768,184 A | 6/1998 | Hayashi et al. |
| 5,768,191 A | 6/1998 | Choi et al. |
| 5,768,287 A | 6/1998 | Norman et al. |
| 5,771,346 A | 6/1998 | Norman et al. |
| 5,790,453 A | 8/1998 | Chevallier et al. |
| 5,828,616 A | 10/1998 | Bauer et al. ................. 365/210 |
| 5,838,612 A | 11/1998 | Calligaro et al. ....... 365/185.03 |
| 5,903,504 A | 5/1999 | Chevallier et al. |
| 5,909,390 A | 6/1999 | Harari |
| 5,912,838 A | 6/1999 | Chevallier |
| 5,943,260 A | 8/1999 | Hirakawa |
| 5,978,289 A | 11/1999 | Merritt |
| 6,049,899 A | 4/2000 | Auclair et al. |
| 6,075,738 A | 6/2000 | Takano |
| 6,078,518 A | 6/2000 | Chevallier |
| 6,112,314 A | 8/2000 | Norman et al. |
| 6,163,479 A | 12/2000 | Chevallier |
| 6,175,937 B1 | 1/2001 | Norman et al. |
| 6,178,114 B1 * | 1/2001 | Yang .................... 365/185.03 |
| 6,278,632 B1 | 8/2001 | Chevallier |
| 6,324,094 B1 | 11/2001 | Chevallier |
| 6,493,260 B2 | 12/2002 | Micheloni et al. ...... 365/185.03 |
| 6,556,469 B2 | 4/2003 | Birk et al. .................... 365/149 |
| 6,563,737 B2 | 5/2003 | Khouri et al. .......... 365/185.21 |
| 6,567,302 B2 | 5/2003 | Lakhani |
| 6,577,532 B1 * | 6/2003 | Chevallier ............. 365/185.03 |
| 6,587,373 B2 | 7/2003 | Talreja .................. 365/185.03 |
| 6,601,191 B1 | 7/2003 | Norman et al. |
| 6,674,385 B2 | 1/2004 | Micheloni et al. ........... 341/155 |
| 6,836,431 B2 | 12/2004 | Chang et al. |
| 7,023,734 B2 * | 4/2006 | Chen .................... 365/185.19 |
| 2005/0038953 A1 * | 2/2005 | Chang ........................... 711/5 |
| 2005/0157555 A1 * | 7/2005 | Ono et al. .............. 365/185.18 |

* cited by examiner

METHOD AND SYSTEM FOR REDUCING SOFT-WRITING IN A MULTI-LEVEL FLASH MEMORY

CROSS-REFERENCE TO RELATED APPLICATIONS

This application claims benefit under 35 USC 119 of Italian Application no. MI2004A 002538, filed on Dec. 29, 2004.

FIELD OF THE INVENTION

The present invention relates to non-volatile memory, and more particularly to a method and apparatus for reducing soft-writing in a multilevel flash memory.

BACKGROUND OF THE INVENTION

Non-volatile memory is a type of memory that preserves data with or without power applied to the memory. Most computer and electronic systems use a binary number system with bits stored in a non-volatile memory. Two distinctly different current levels that flow through the memory under the correct conditions represent each bit, which may be represented by a one or a zero.

Some memory is single-level, where one bit of information is stored in each memory cell. In order to determine the value of the memory cell, current through the memory cell is compared to a reference cell. A current through the memory cell that is higher than that through the reference cell represents one bit value (e.g., the number one), while a current through the memory cell that is lower than that through the reference cell represents the other bit value (e.g. the number zero).

Other memory is multi-level, having more than one bit in each memory cell. Multiple bits require more than two levels of current to represent the bits, further reducing the margin for error in reading memory cells. The margin for error is more limited in multi-level memory than in single-level memory.

FIG. 1A illustrates a conventional circuit for a matrix array of M rows and P bit lines (M and P being integers). Matrix memory array 1 includes an array of M×P cells, which during a read operation row decoder 2 selects word line WLS 3. Column decoder and polarization circuit 4 selects bit lines BL1-BLN 5, for N total cells 6 (N being an integer). All selected cells 6 belong to the same word line 3 and each have their own bit line 5.

Reference word lines 7 select a row of reference cells 8, while reference bit lines 9 from polarization circuit 11 select the column. Typically, reference word lines 7 are all at the same voltage level VXR, which is also the voltage for word line WLS 3. Reference bit lines 9 and bit lines 5 for the matrix memory array 1 are typically around 1V. Word lines 3 that are not active are held at 0V, while unselected bit lines 5 are floating. The voltage VXR applied to cells 6 is higher than the three reference cell's 8 threshold voltages.

The current in each of the N selected cells 6 is compared to one reference cell 8 in the case of a single bit memory cell, or to three reference cells 8 in the case of a two bit memory cell.

For a single bit memory cell, one reference cell is needed to distinguish two current values, defined by 0 and 1. When a selected cell 6 has a current value higher than the reference cell 8 divided by a factor R (ratio), then the selected cell 6 is holding a value of 1. Otherwise, selected cell 6 is holding a value of 0.

FIG. 1B is a graph illustrating voltage threshold distributions for matrix cells in a single bit memory. FIG. 1B is discussed in conjunction with FIG. 1A. A reference cell 8 has a threshold voltage (Vtr) 13 at which it activates. In order to read on the gate of a selected cell 6 and/or a reference cell 8, a voltage VXR read 15 must be higher than the threshold voltage Vtr 13. For each read, N different cells 6 are selected while the same reference cell 8 is always polarized. If the current (or its ratio/multiple) read from a memory cell is above the reference cell, then the value in the memory cell is 1, otherwise it is 0.

In a two-bit matrix cell, three read reference cells are used to distinguish between four different current states called 11, 10, 01, and 00. Each memory cell can have four different current values. Current values correspond to threshold values. In the case of a two-bit memory cell, there are four threshold distributions that represent the four current states, distributed around the three reference cells (see FIG. 2) during 'modify' operations.

For example, FIG. 1C illustrates a simplified conventional memory circuit 10. Memory cells 12-1 through 12-n (collectively referred to as memory cells 12) are connected through drain polarization circuits 14-1 through 14-n (collectively referred to as polarization circuits 14) to current comparison circuit 16. Three reference cells 18A, 18B, 18C (collectively referred to as reference cells 18) make up a reference cell matrix for a two-bit memory cell. During a memory read, an enable signal is sent to drain polarization 14, while a voltage VXR is applied to the gate of memory cell 12 by a row decoder (not shown). $Id_{13}$ cell current flows through memory cells 12 and drain polarization circuits 14. Reference cells 18 have their gates brought to voltage VXR, while an enable signal is sent to drain polarizations 20A, 20B, and 20C (collectively referred to as drain polarizations 20). Different currents ($Id_{13}$ ref1, $Id_{13}$ ref2 and $Id_{13}$ ref3) flow through reference cells 18. Current comparison circuit 16 compares the different currents to each $Id_{13}$ cell current of the selected cell (flowing through memory cells 14) and determines to which of the four different current states $Id_{13}$ cell current belongs for each matrix selected cell. Based on the results of the comparison, the current comparison circuit 16 makes a determination about the two-bit value stored in each of memory cells 12. The value may be one of 00, 01, 10, or 11, in a two-bit cell.

In order to turn on all the reference cells 18, a sufficiently high voltage VXR must be used, for example 5.75-6V, which is about 1V higher than in a single bit memory. FIG. 2 is a graph illustrating voltage threshold distributions for matrix cells in multilevel memory. VXR 30 is the voltage level typically applied to the gates of memory cells 12 and all of reference cells 18 in FIG. 1C. Four matrix cell distributions are in a two-bit memory cell, namely 11, 10, 01, and 00, determined in a modify operation. The three read reference voltage thresholds are Vtr1 32A, Vtr2 32B, and Vtr3 32C. VXR in FIG. 1C should be high enough to turn on all of reference cells 18, and high enough to supply current in order to read the cells within the time allotted. Higher voltage levels improve current comparison circuit 16 access and read times, however if it is too high then selected reference and memory cells may be soft-programmed or soft-written. High gate voltage and a polarized drain may result, particularly in an erased cell being soft-written. This will cause false reads from the memory cell.

With a high voltage level VXR 30, it is possible to move the threshold voltage of reference cells 18 upward, including cells of distributions 11, 10, and 01, especially reference cell 18A and matrix cells belonging to low threshold distribution 11, which have the lowest voltage threshold level. Furthermore, the space between the distribution of voltage threshold levels, and space between the read reference thresholds and matrix cell threshold distributions may decrease, also causing memory read fails if current comparison circuit 16 could be unable to differentiate between the cells.

The distance between matrix cell distributions and reference thresholds defines the read error margin. So that if, for example, reference cell VTR1, after several reads, is soft-written, the margin to correctly read a cell belonging to distribution 10 is reduced.

While important in single-level memory, the problem of soft-writing becomes significant in multi-level memory due to the decreased space between voltage thresholds. The higher gate voltage necessary to activate a greater number of cells than in a two-bit memory compounds the problem.

Accordingly, what is needed is a system and method for reducing soft-writing in reference cells and matrix cells in a multi-level flash memory. The present invention addresses such a need.

SUMMARY OF THE INVENTION

A system and method for reducing soft-writing in a multi-level flash memory during read or verify includes a memory cell. A first group and second group of reference cells are coupled to the memory cell and are configured to receive a first and a second voltage. A current comparison circuit is coupled to the first and second groups of reference cells and to the memory cell and is configured to compare current flow through the memory cell with current flow through the first group of reference cells, and to determine whether the memory cell holds a first range of values. The first group of reference cells receives the first voltage, and if the memory cell does not hold the first range of values, the system determines whether the memory cell holds a second range of values. Only the second group of reference cells receives the second voltage, thereby reducing soft-writing during the read operation.

Each group of reference cells includes one or more reference cells. The number of groups of reference cells may differ and may change according to the kind of multilevel cell, according to the number of bits per cell.

In one possible solution for a two-bit memory cell, a first group of reference cells could include two reference cells while a second group of reference cells could include a single reference cell.

According to the method and system disclosed herein, the present invention reduces soft-writing in a multilevel flash memory by applying a lower voltage during a memory read or verify than conventional systems. In a 2 bit memory cell, there are three read reference cells in which first the first and second read reference cells are used in a first read while the third reference cell is used in a second read. The first two read reference cells are configured to receive a first gate voltage in a first phase that is lower than in a conventional system, while the third read reference cell is configured to receive a higher gate voltage (for example, the gate voltage applied to reference cells in conventional systems) during a second phase of the read, if the first phase does not yield the memory value.

In the first phase of a memory read, first and second read reference currents are compared to all selected array memory cells (whose gate receive first phase gate voltage and whose drains are polarized) to determine whether all the selected memory cells hold a first range of values (11, 10). If all selected array cells belong to one of the two first values (11 or 10), then the memory read is complete, without completing the second phase.

Otherwise, if the selected memory array does not hold the first range of values, then a second read phase is initiated in order to determine which of the second range of values (01 and 00) is in the array of memory cells. In the second phase, the read reference cells (that have a lower threshold voltage) used in the first phase are turned off such that their gates and drains are not polarized, and a second higher gate voltage is applied to the third read reference (that has a higher voltage threshold) and its drain is polarized (in order to turn on the third read reference cell). The drains of the reference cells that were polarized during the first read phase are no longer polarized, therefore reducing soft-writing during the read operation by avoiding a high gate voltage at the same time that their drains are polarized.

In a matrix cell, a word of 8/16 cells has the same wordline to each cell. During the first phase of a read operation, if the value is not discerned then the gate voltage across all the cells may be increased. However, if the drains on the low threshold cells are not polarized, then soft-writing will be reduced.

Accordingly, in a first embodiment of the invention, soft-writing is reduced by deactivating both the gate voltage and drain polarization for low-threshold reference cells during subsequent phases of a read operation. Read reference cells are more vulnerable to soft-writing than matrix cells because they are polarized for each read while the selected matrix cells are different for each read. In conventional systems, read reference cells have a polarized drain and have high gate voltage more often than matrix cells. According to one embodiment of the invention, some reference cells (in particular the lower threshold ones) have a reduced gate voltage with their drain polarized.

In a second embodiment of the invention, for matrix selected cells, soft-writing is reduced by deactivating the drain polarization for matrix low-threshold cells during subsequent phases of a read operation, although a gate voltage may still be applied. This may avoid the case of high gate voltage with a polarized drain on low threshold cells.

DETAILED DESCRIPTION OF THE INVENTION

The present invention relates to non-volatile memory, and more particularly to a method and apparatus for reducing soft-writing in a multilevel flash memory. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Figure 3:
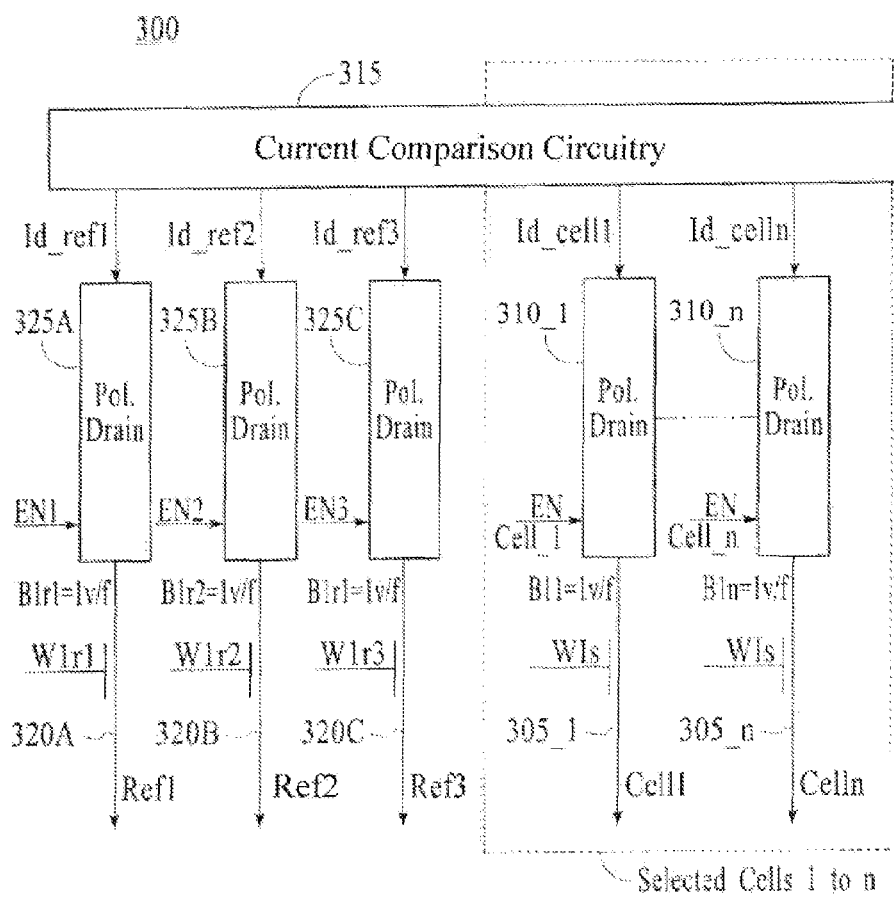
FIG. 3 is a block diagram illustrating one embodiment of the invention in a memory circuit.

FIG. 3 is a block diagram illustrating one embodiment of the invention in a two-bit memory circuit 300. Selected memory cell 305 is connected through drain polarization circuit 310 to current comparison circuit 315. Three reference cells 320A, 320B, and 320C (collectively referred to as 320) make up a reference cell matrix for two-bit memory cell 305. Drain polarization circuits 325-A, 325-B, and 325-C (collectively referred to as 325) connect reference cells 320 to current comparison circuit 315. Drain polarization circuits 310 and 325 polarize the drain of selected memory cell 305 and reference cells 320 (respectively) during read memory operations. Selected memory cells of the array 305-1 through 305-$n$ are collectively referred to as 305. Drain polarization circuits 310-1 through 310-$n$ are collectively referred to as 310.

Figure 4:
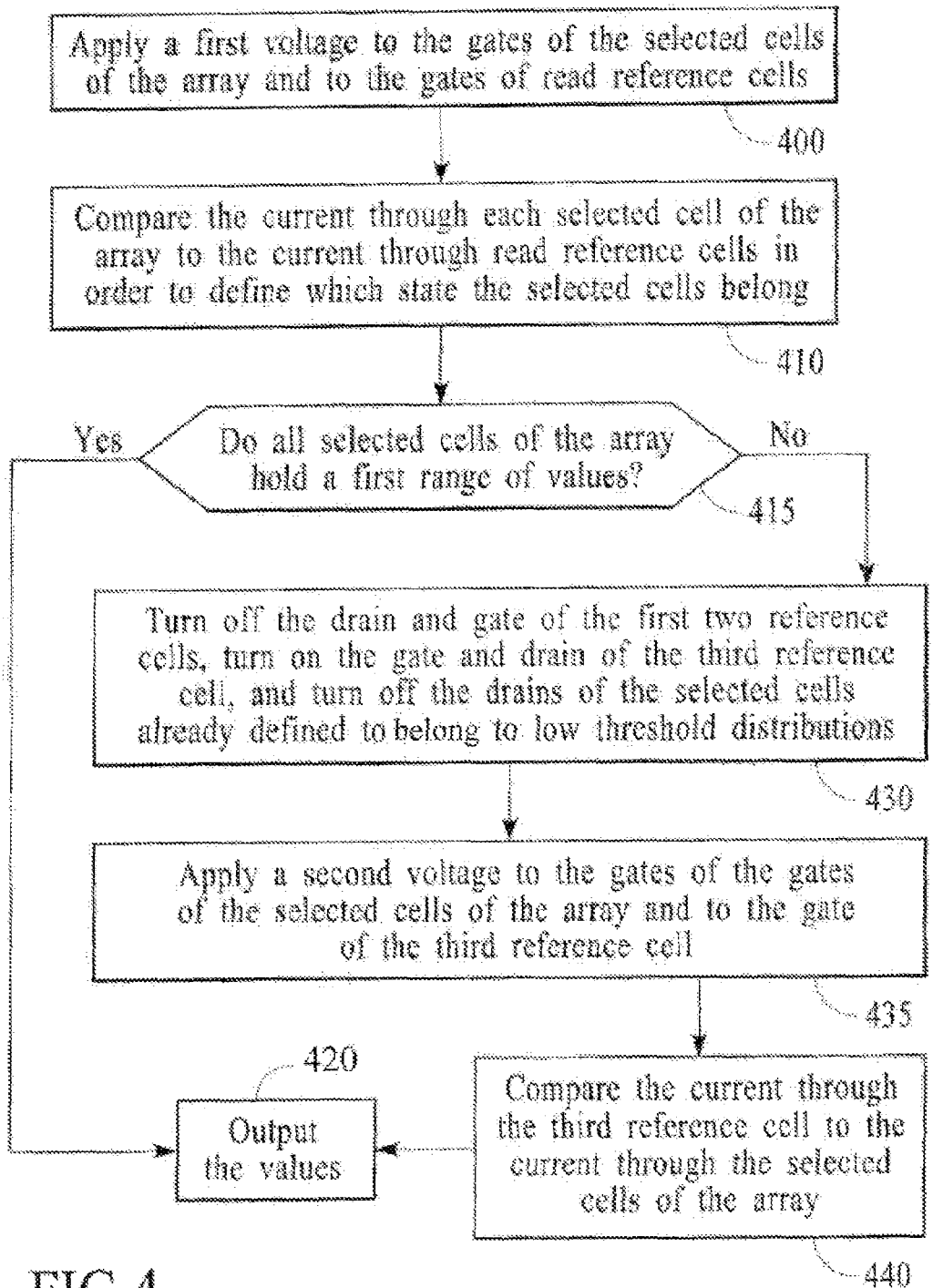
FIG. 4 is a flow diagram illustrating one method for reducing soft-writing in the memory circuit of FIG. 3.

FIG. 4 is a flow diagram illustrating one method for reducing soft-writing in the memory circuit 300 of FIG. 3 during a read operation. In block 400, a row decoder (not shown) applies a voltage VXR1 (illustrated in FIG. 6) to the gate of memory cell 305 in FIG. 3 and to the gates of reference cells 320A and 320B. Drain polarization circuits 325A, 325B and 310 also receive enable signals, polarizing the drains of reference cells 320A and 320B, and selected memory cells 305. Voltage VXR1 may be less than voltage VXR in a conventional system, for example 1 volt lower, and sufficiently high to activate reference cells 320A and 320B.

Current comparison circuit 315 compares the current flowing through reference cells 320A and 320B with the current flowing through each memory cell 305. The following comparisons are one example of current representation. A current level through memory cell 305 that is greater than current through reference cell 320A may represent a bit value of 11. A current level through memory cell 305 that is greater than current through reference cell 320B and lower than current through reference cell 320A may represent a bit value of 10. A current level through memory cell 305 that is lower than current through reference cell 320B may represent a still undefined bit value that does not belong to the first range of values (11,10).

In block 410, current comparison circuit 315 determines whether the memory cell 305 holds a first range of values, for example bit values 11 and 10. Because lower voltage VXR1 has activated only reference cells 320A and 320B, a higher range of values (in this example 01 and 00) is not determined with reference cells 320A and 320B. Advantages of the lower activation voltage include a decreased likelihood of soft-writing memory cell 305 and of shifting the thresholds or soft-writing of reference cells 320A and 320B.

In block 415, if the current comparison circuit 315 determines that the current flowing through all memory cells 305 falls within the range for reference cells 320A and 320B, then the two-bit value stored in memory cell 305 is determined and a memory read, for example, may finish with outputting the values, as in block 420. One skilled in the art will recognize that other operations may occur, for example memory verify operations (to which the present invention applies as well), but for simplicity are not reviewed here.

If the current comparison circuit 315 determines that at least one of the currents flowing through memory cells 305 falls outside the range for reference cells 320A and 320B, then in block 430 the drains and gates of reference cells 320A and 320B are turned off and the drain and gate of reference cell 320C are turned on. Then, in block 435, a second, higher voltage VXR2 is applied to the memory cells 305 and to reference cell 320C, while the drains of the cells belonging to the 11 or 10 state are turned off. Drain polarization circuit 325-C receives an enable signal and activate the drain of reference cell 320C while drain polarization circuits 325-A and 325-B are left floating during the second memory operation. Only a part of the drain polarization circuit 310 is disabled, which corresponds to already defined selected cells whose drains are left floating.

Voltage VXR2 may be at the same level as voltage VXR in conventional systems, and another reading is done with reference cell 320C. In block 440, current comparison circuit 315 determines which value each still undefined memory cell 305 holds along a second range of values, for example 01 and 00, by determining whether the current flowing through each still undefined memory cell 305 is greater than or less than the current flowing through reference cell 320C.

Although two read sequences (or compare sequences) are described, they refer to the same read operation of memory circuit 300. A single read operation, seeking the value in memory circuit 300, may have multiple reads (or compares) of the memory cell according to the present invention (or a single read if the value is a lower range).

Figure 5:
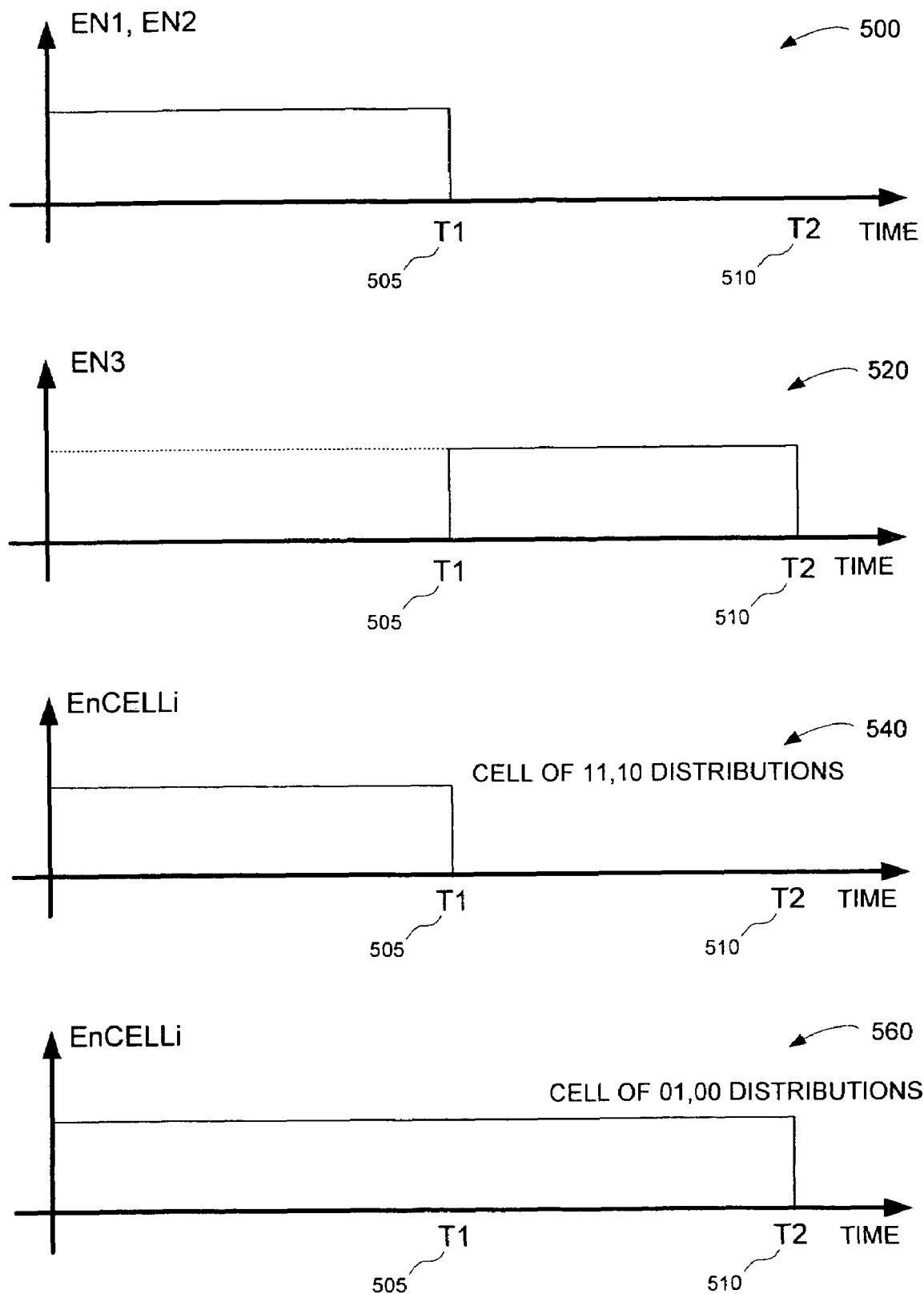
FIG. 5 is a timing diagram illustrating enable signals applied to the drain polarization circuits in FIG. 3.

FIG. 5 is a timing diagram illustrating enable signals transmitted to the drain polarization circuits 325 and 310 in FIG. 3. In each of graphs 500, 520, 540, and 560, the horizontal axis represents time while the vertical axis represents signal level. From time zero to time T1 505 corresponds to a first read sequence in a read operation, while time T1 505 to time T2 510 corresponds to a second read in a single read operation of memory circuit 300, for example. In order to speed access time, EN3 in graph 520 may be set high for both first and second read sequences, as illustrated by the dotted line in graph 520.

In graph 500, drain polarization circuits 325-A and 325-B receive enable signals EN1 and EN2 at the beginning of a read operation, for example. Graph 540 illustrates that polarization circuit 310 receives enable signal EnCelli during the same period. From time zero to time T1 505 corresponds approximately to blocks 400 and 415 in FIG. 4, after voltage is applied to reference cells 320A and 320B in block 400. If the value stored in the selected cell 305 is one in the lower memory range, for example 11 or 10, its corresponding enable signal EnCelli is deasserted at time T1 505 because its value is found and a second read is unnecessary. Enable signal EnCelli of the drain polarization circuit 310 will be deasserted after the first read if the corresponding cell 305 belongs to state 11 or 10, otherwise it may remain high if cell 305 belongs to 01 or 00 state and a second read is needed. Signals EN1 and EN2 are deasserted at the end of the first read if a second read is necessary.

If at least one of the values stored in the selected memory circuit cells 305 is in the upper range, for example, 01 or 00, then graph 520 illustrates time T1 505 to time T2 510. When at least one of the values stored in the selected memory circuit cells 300 is in the upper range, its corresponding enable signal EnCelli for drain polarization 310 remains asserted from zero through time T1 505 until time T2 510, as illustrated in graph 560, because the value was not found during the first read and a second read is necessary (for a two-bit memory circuit).

During the second read, enable signals EN1 and EN2 are deasserted from time T1 505 to time T2 510, as illustrated in graph 500, in order to float the drains of reference cells 320A and 320B, reducing the likelihood of soft-writing and shifting the voltage threshold. Enable signal EN3, received by drain polarization circuit 325-C in FIG. 3, is asserted from time T1 505 to time T2 510, as illustrated in graph 520. Also, enable signal ENCelli, corresponding to the drains of the selected cell not yet defined in the first phase read and received by one of drain polarization circuits 310 in FIG. 3, is asserted from time zero through time T2 510, corresponding to both read sequences, as illustrated in graph 560. A second read is performed during a given read operation of memory circuit 300 when the stored value is in the upper range (for example, 01 and 00).

Figure 6:
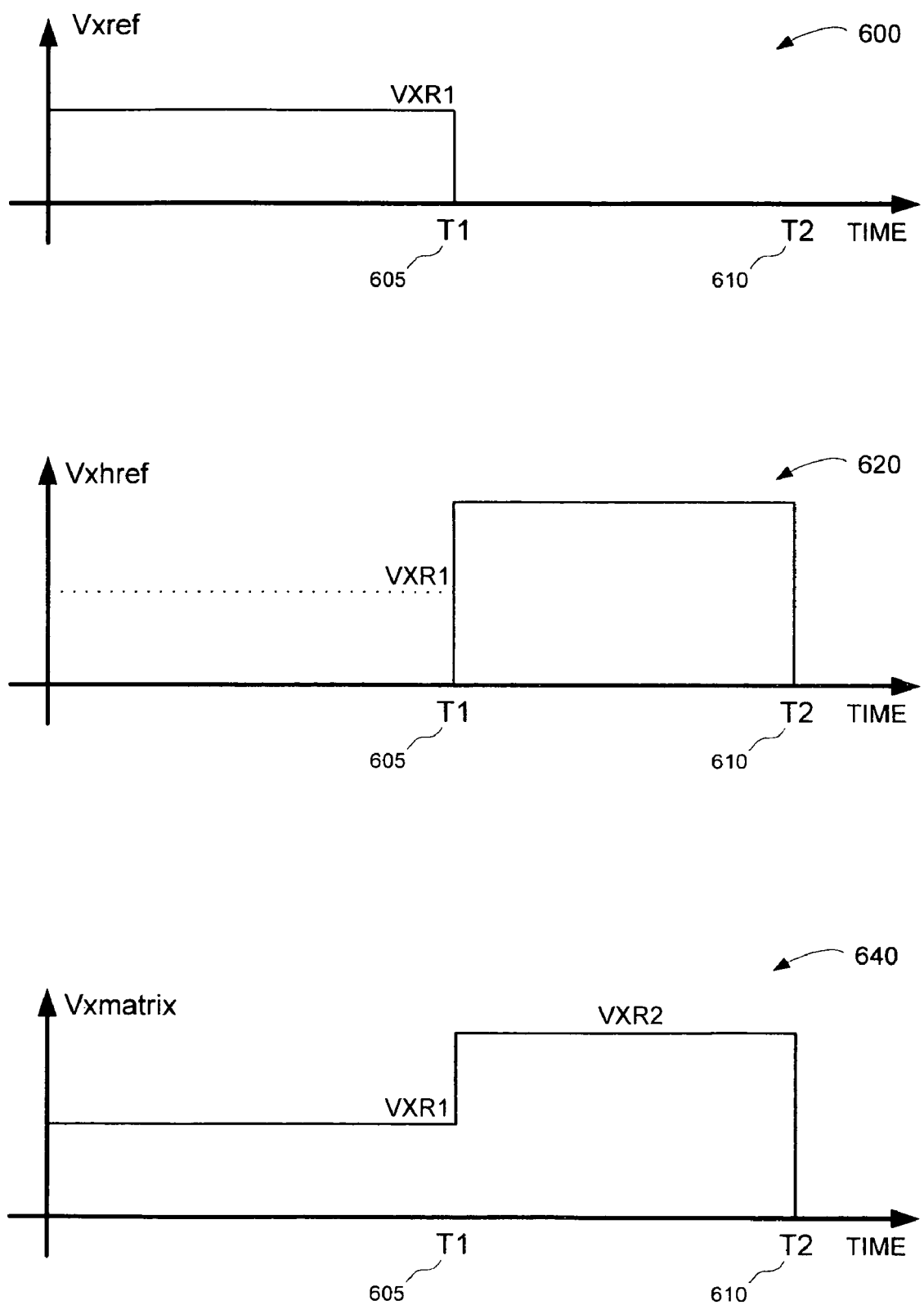
FIG. 6 is a voltage diagram illustrating gate voltages applied to the reference and memory cells in FIG. 3.

FIG. 6 is a voltage diagram illustrating gate voltages applied to the reference cells 320 and memory cell 305 in FIG. 3. Graphs 600 and 620 correspond to reference cells 320 and graph 640 corresponds to memory cell 305. In each of graphs 600, 620, and 640, the horizontal axis represents time while the vertical axis represents voltage level. Time T1 605 corresponds to time T1 505 in FIG. 5 while time T2 610 corresponds to time T2 510 in FIG. 5. As in FIG. 5, from time zero to time T1 605 corresponds to a first read in a single read operation, while time T1 605 to time T2 610 corresponds to a second read in a single read operation of memory circuit 300, for example.

In graph 600, voltage VXR1 is applied to the gate of reference cells 320A and 320B, from time zero to time T1 605. Voltage VXR1 is less than voltage VXR applied in conventional systems, but great enough to activate reference cells 320A and 320B and lower than the voltage required to activate reference cell 320C. Time T1 605 is at approximately the end of the first read sequence, or about the time block 415 in FIG. 4 is beginning.

If all selected array cells 305 belong to the lower range, then the read operation is finished. However, if at least one of the array of selected cell values is in the upper range then voltage VXR2 is applied to reference cell 320C from time T1 605 to time T2 610, as illustrated in graph 620. To speed up read, the gate of reference cell 320C may be polarized during the first read.

Graph 640 illustrates that in the case where at least one of the bit values is in the upper range, voltage VXR1 may be applied to memory cells 305 from time zero to time T1 605, and voltage VXR2 is applied to memory cells 305 from time T1 605 to time T2 610.

Figure 1A:
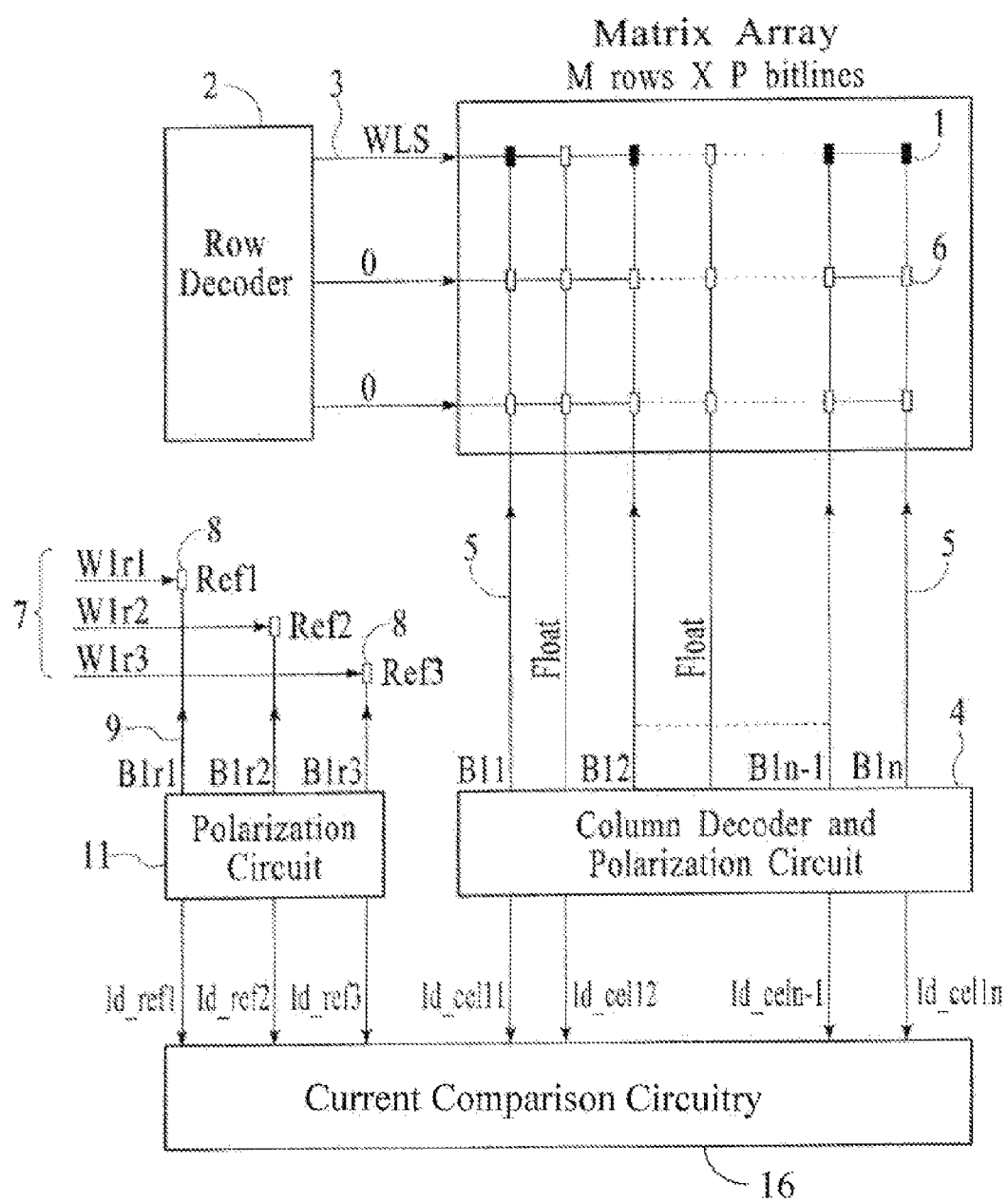
FIG. 1A is a simplified schematic illustrating a conventional circuit for a matrix array of M rows and P bit lines.
Figure 1B:
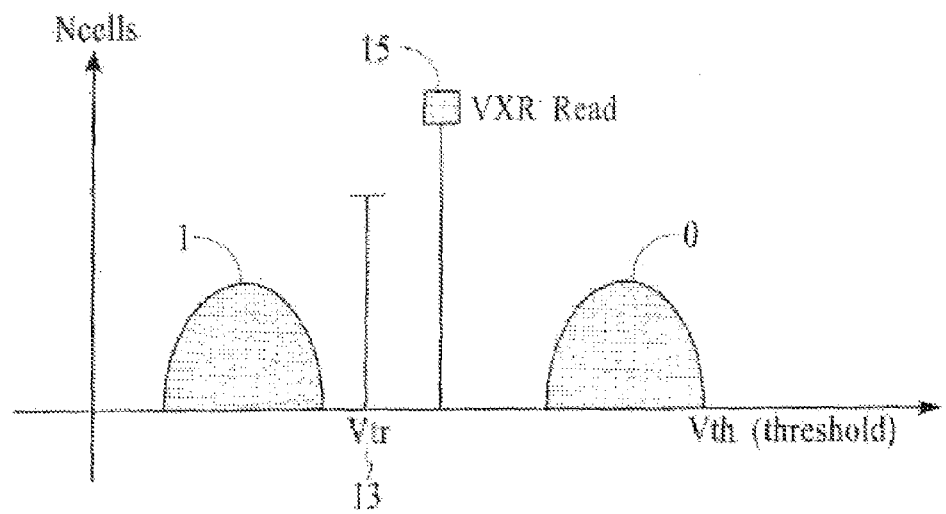
FIG. 1B a graph illustrating voltage threshold distributions for matrix array cells in a single bit memory.
Figure 2:
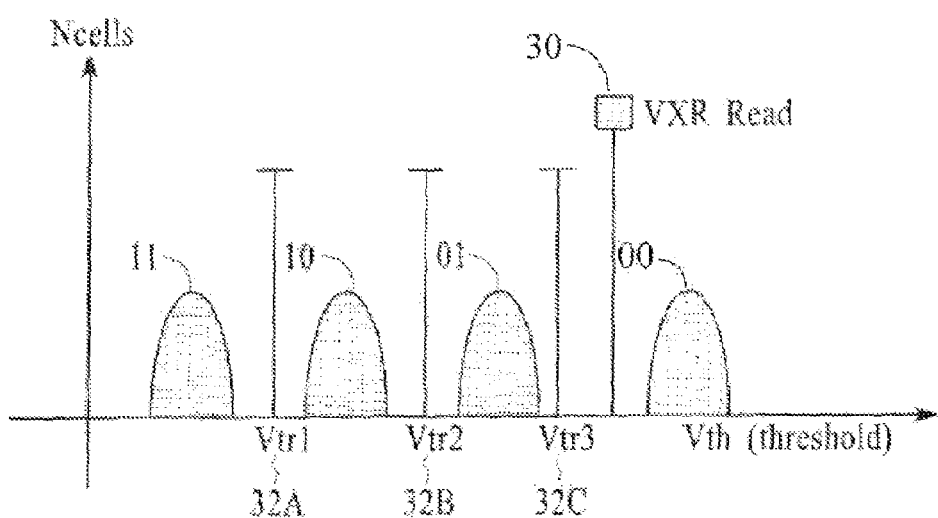
FIG. 2 a graph illustrating voltage threshold distributions for a matrix array of cells in a multilevel memory.
Figure 1C:
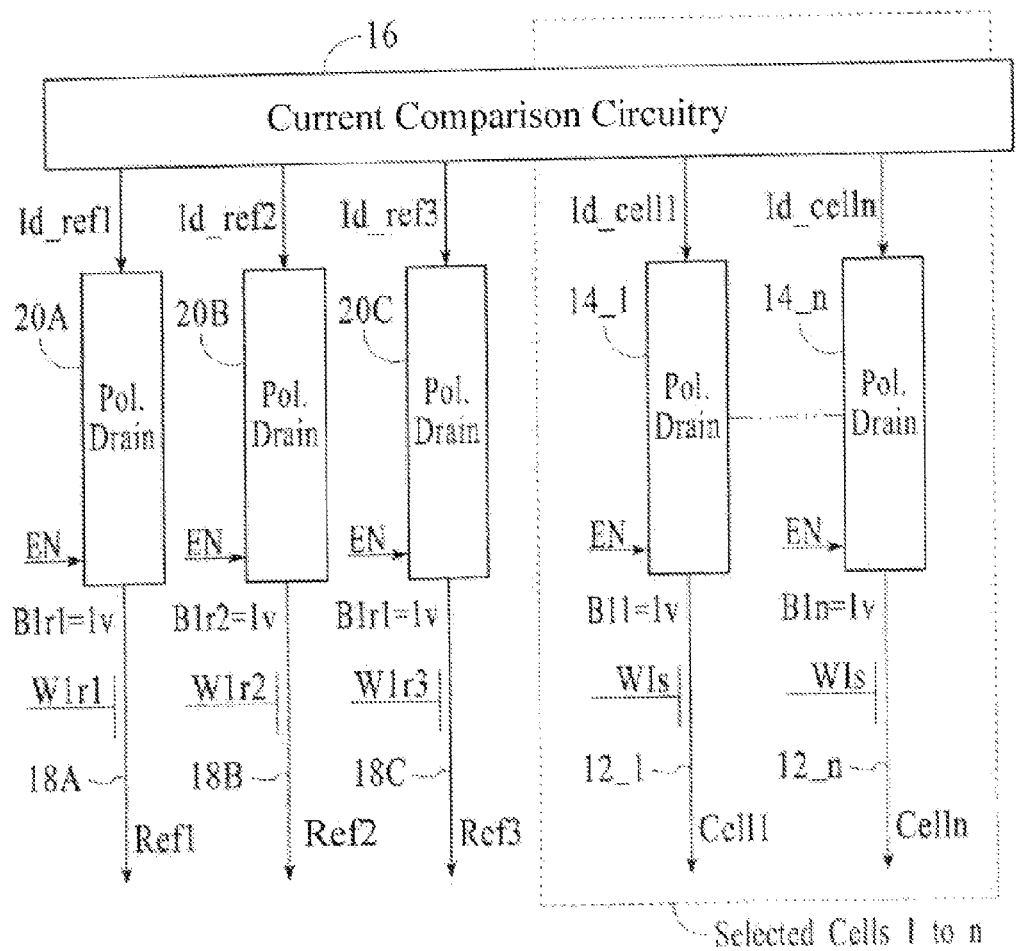
FIG. 1C is a schematic diagram illustrating a conventional memory circuit and reference cell routing system.
Figure 7:
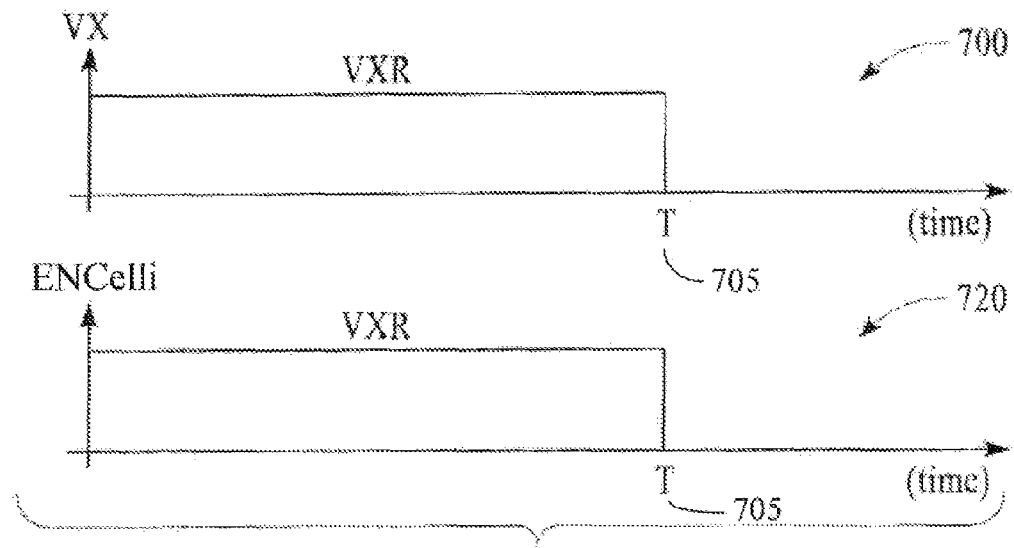
FIG. 7 is a voltage and timing diagram for a conventional system illustrating enable signals applied to the drain polarization circuits 20 and 14 and voltage applied to reference cells 18 and memory cell 12 in FIG. 1.

FIG. 7 is a voltage and timing diagram for a conventional system illustrating enable signals applied to the drain polarization circuits 20 and 14 and voltage applied to reference cells 18 and memory cell 12 in FIG. 1C. Graph 700 illustrates that voltage level VXR is applied to the gates of reference cells 18 and memory cells 12 from time zero through time T 705, or throughout a read operation of conventional memory circuit 10. Through the same time period, drain polarization circuits 20 and 14 receive an enable signal, as illustrated in graph 720.

Figure 8:
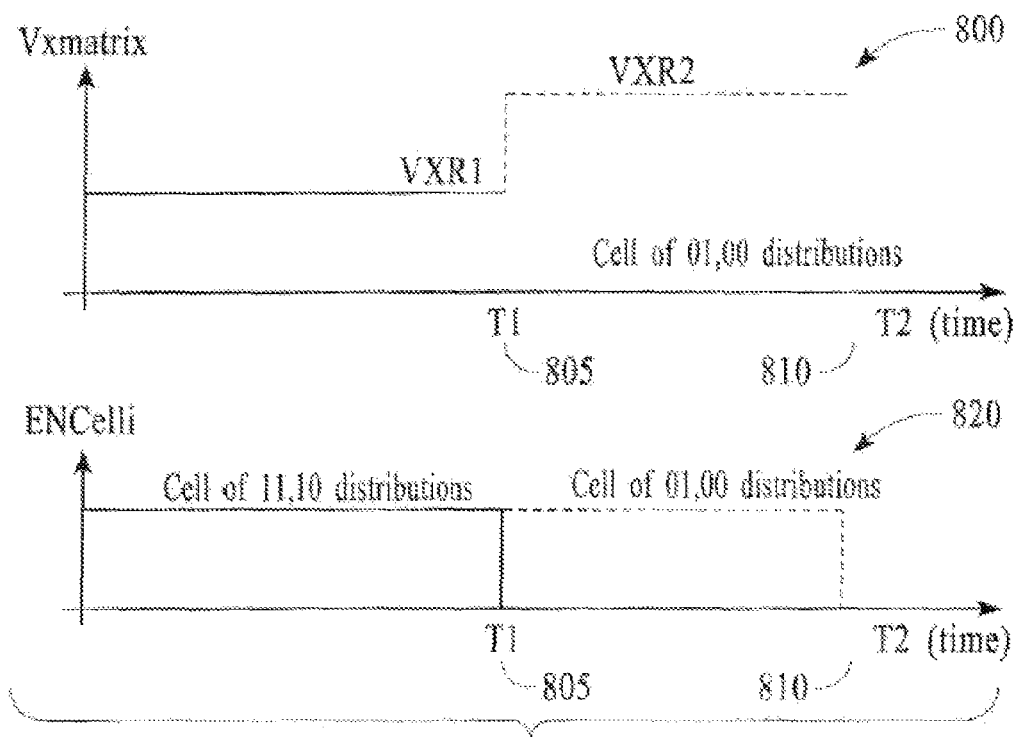
FIG. 8 is a voltage and timing diagram illustrating enable signals applied to the drain polarization circuits, and gate voltage applied to the memory cell in FIG. 3.

In contrast, FIG. 8 is a voltage and timing diagram illustrating enable signals applied to the drain polarization circuits 310 and voltage applied to memory cells 305 in FIG. 3. During a read operation of memory circuit 300, for example, voltage VXR1 is applied to the gate of reference cells 320A and 320B, and to the gate of memory cell 305, from time zero to time T1 805, as illustrated in graph 800. If the values stored in all selected cells of the array are in the lower range, then at approximately time T1 805, voltage will then decrease to zero (not illustrated).

However, in the case that at least one of the selected cells of the array belongs to the upper range, then from time T1 805 to time T2 810, voltage VXR2 is applied to memory cells 305 and reference cell 320C, as illustrated in graph 800. Graph 800 differs from graph 700 (see FIG. 7) in that two different voltage levels may be applied to a memory circuit during a read operation, with voltage VXR1 lower than voltage VXR. Drains of selected cells have a different enable signal so that drains of cells that have already been defined in the first read phase can be left floating during the second read phase, thereby reducing the likelihood of soft-writing by avoiding a high gate voltage with a polarized drain for low threshold cells.

Finally, graph 820 illustrates the enable signal ENCelli transmitted to drain polarization 310 during the two periods. If a selected cell value in the lower range is detected around time T1 805, then the enable signal is not asserted. However, if the value is not in the lower range, then the enable signal continues though time T2 810. In conclusion, the enable signal ENCelli will be high for two phases of a read sequence if the corresponding cell 305 belongs to the 01 or 00 distributions. Otherwise, the enable signal will be high only during the first read because the corresponding selected cell will be determined to belong to the 11 or 10 distributions.

In another embodiment, the time used in reading a memory circuit may be decreased by, for example, polarizing the drain of reference cell 320C (see FIG. 3) during a first read even though only reference cells 320A and 320B are being activated. By pre-polarizing the drain of reference cell 320C, time may be saved if reference cell 320C is accessed during a second read.

In an additional embodiment, the gate of reference cell 320C may be pre-charged to VXR1/VXR2 during a first read. In other words, the gates of each of the reference cells 320 may be brought to VXR1, a voltage level that will activate only reference cells 320A and 320B, not 320C. By pre-charging the gate of reference cell 320C, the time needed to complete charging to VXR2 if a second read is necessary will be decreased. Additionally, VXR1 and VXR2 may be increased in order to achieve greater speed.

Pre-charging gates and pre-polarizing drains of reference cells may be used together or separately in order to decrease the amount of time needed for a second or further read sequence. The total time for two read sequences using the invention with pre-charging and pre-polarizing may be only slightly greater than the entire time taken in conventional systems for a read operation, providing the benefits of reducing the likelihood of soft-writing and threshold drift with a small impact on speed.

In an additional embodiment, because only two read reference cells are used in the first read and only one used in the second, it may be possible to use only two sense amplifiers or comparators rather than 3.

One of ordinary skill in the art will recognize that the above embodiments apply to a two-bit memory circuit, but also that the invention may be implemented with a multi-level memory with more than two bits, for example three, four, or eleven bits. More read sequences may be used for correspondingly more bits, with several (rather than only two) levels of voltage being used. For example, in a four-bit memory, 16 values are stored so 15 reference cells may be used. 14 read sequences may be used, or 13, or 7, or however many a designer wishes to implement, balancing the likelihood of soft-writing the reference cells/matrix cells and threshold drift with speed and timing.

The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

We claim:

1. A method for reducing soft-writing in a multilevel flash memory during a read operation, the method comprising:
   applying a first voltage to a memory cell in the multilevel flash memory and to a first reference cell coupled to the memory cell;
   determining, after applying the first voltage, whether the memory cell holds a first range of values;
   polarizing a drain of a second reference cell connected to the memory cell while applying the first voltage to the first reference cell, thereby decreasing an amount of time needed to determine whether the memory cell holds a second range of values; and
   if the memory cell does not hold the first range of values, then applying a second voltage to the memory cell and to the second reference cell coupled to the memory cell.

2. The method of claim 1, wherein the second voltage is higher than the first voltage.

3. The method of claim 1, wherein applying a first voltage to a reference in combination with setting an enable signal allows reading of the multilevel bit with one application of voltage.

4. A method for reducing soft-writing in a multilevel flash memory during a read operation, the method comprising:
   applying a first voltage to a memory cell in the multilevel flash memory and to a first reference cell coupled to the memory cell;
   determining, after applying the first voltage, whether the memory cell holds a first range of values;
   if the memory cell does not hold the first range of values, then applying a second voltage to the memory cell, and to a second reference cell coupled to the memory cell, wherein the second voltage is higher than the first voltage;
   determining, after applying the second voltage, whether the memory cell holds a second range of values, wherein the second range of values differs from the first range of values; and
   wherein determining whether the memory cell holds a first range of values comprises polarizing a drain of the second reference cell while applying the first voltage to the first reference cell, thereby decreasing an amount of time needed to determine whether the memory cell holds the second range of values.

5. The method of claim 4, further comprising:
   floating the first reference cell while applying the second voltage to the second reference cell.

6. The method of claim 4, further comprising:
   floating the first reference cell while applying the second voltage to the second reference cell.

7. The method of claim 4, wherein applying a first voltage to a reference in combination with setting an enable signal allows reading of the multilevel bit with one application of voltage.

8. A multilevel flash memory comprising:
   a memory cell configured to store a range of values;
   a first reference cell and a second reference cell coupled to the memory cell, the first reference cell being configured to receive a first voltage during a read operation and the second reference cell being configured to receive a second voltage during the read operation; and
   a current comparison circuit coupled to the first reference cell and the second reference cell and the memory cell, the current comparison circuit configured to
   compare current flow through the memory cell with current flow through the first reference cell and the second reference cell,
   determine whether the memory cell holds a first range of values while the first reference cell receives the first voltage,
   polarize a drain of the second reference cell while the first reference cell is receiving the first voltage, thereby decreasing an amount of time needed to determine whether the memory cell holds the second range of values, and
   if the memory cell does not hold the first range of values, the current comparison circuit is further configured to determine whether the memory cell holds a second range of values while the second reference cell receives the second voltage, thereby reducing soft-writing during the read operation.

9. The multilevel flash memory of claim 8, wherein the second voltage is higher than the first voltage.

10. The multilevel flash memory of claim 9, wherein the second range of values differs from the first range of values.

11. The multilevel flash memory of claim 9, wherein the memory cell is further configured to receive the first voltage and the second voltage.

12. The multilevel flash memory of claim 8, wherein the current comparison circuit is further configured to float the first reference cell while the second reference cell is receiving the second voltage.

13. The multilevel flash memory of claim 11, wherein the current comparison circuit is further configured to float the first reference cell while the second reference cell is receiving the second voltage.

14. The multilevel flash memory of claim 8, wherein the current comparison circuit includes a number of sense amps corresponding to a number of groups of cells being read.

15. A method for reducing soft-writing in a multilevel flash memory during a read operation comprising:
   applying a first voltage to a first reference cell in the multilevel flash memory;
   determining, after applying the first voltage, whether a memory cell coupled to the first reference cell holds a first range of values;
   if the memory cell does not hold the first range of values, then applying a second voltage to a second reference cell coupled to the memory cell; and
   polarizing a drain of the second reference cell while applying the first voltage to the first reference cell, thereby decreasing the amount of time needed to determine whether the memory cell holds the second range of values.

16. The method of claim 15, wherein the second voltage is higher than the first voltage.

17. The method of claim 16, further comprising:
   determining, after applying the second voltage, whether the memory cell holds a second range of values, wherein the second range of values differs from the first range of values.

18. The method of claim 17, further comprising floating the first reference cell while applying the second voltage to the second reference cell.

19. The method of claim 15, wherein applying a first voltage to a reference in combination with setting an enable signal allows reading of the multilevel bit with one application of voltage.

20. A multilevel flash memory comprising:
   a memory cell configured to receive a first voltage and a second voltage;

a first reference cell and a second reference cell coupled to the memory cell; and a current comparison circuit coupled to the first reference cell and the second reference and the memory cell, the current comparison circuit configured to compare current flow through the memory cell with current flow through the first reference cell and the second reference cell during a read operation, determine whether the memory cell holds a first range of values while the memory cell receives the first voltage, polarize a drain of the second reference cell while the memory cell is receiving the first voltage, thereby decreasing an amount of time needed to determine whether the memory cell holds the second range of values, and if the memory cell does not hold the first range of values, the current comparison circuit is further configured to determine whether the memory cell holds a second range of values while the memory cell receives the second voltage, thereby reducing soft-writing during the read operation.

21. The multilevel flash memory of claim 20, wherein the second voltage is higher than the first voltage.

22. The multilevel flash memory of claim 21, wherein the second range of values differs from the first range of values.

23. The multilevel flash memory of claim 22, wherein the current comparison circuit is further configured to float the first reference cell while the memory cell is receiving the second voltage.

24. The multilevel flash memory of claim 20, wherein the current comparison circuit includes a number of sense amps corresponding to a number of group of cells being read.

* * * * *

UNITED STATES PATENT AND TRADEMARK OFFICE
CERTIFICATE OF CORRECTION

PATENT NO. : 7,522,455 B2  
APPLICATION NO. : 11/144174  
DATED : April 21, 2009  
INVENTOR(S) : Bedarida et al.

Page 1 of 1

It is certified that error appears in the above-identified patent and that said Letters Patent is hereby corrected as shown below:

On Sheet 1 of 8, in Fig. 1A (Above Reference Numeral – 16), line 1, delete "Id_celn-1" and insert -- Id_celln-1 --, therefor.

In column 2, line 22, after "18B," insert -- and --.

In column 2, line 27, delete "$Id_{13}cell$" and insert -- Id_cell --, therefor.

In column 2, line 32, delete "$Id_{13}ref1$, $Id_{13re}ref2$ and $Id_{13}ref3$" and insert -- Id_ref1, Id_ref2 and Id_ref3 --, therefor.

In column 2, line 34, delete "$Id_{13}cell$" and insert -- Id_cell --, therefor.

In column 2, line 36, delete "$ld_{13}cell$" and insert -- Id_cell --, therefor.

In column 2, line 45, after "in" insert -- a --.

In column 6, line 56, delete "example," and insert -- example --, therefor.

In column 9, line 34, in Claim 4, delete "cell," and insert -- cell --, therefor.

Signed and Sealed this

Twenty-first Day of July, 2009

JOHN DOLL  
*Acting Director of the United States Patent and Trademark Office*